(12) United States Patent
Hira et al.

(10) Patent No.: US 7,656,077 B2
(45) Date of Patent: Feb. 2, 2010

(54) LAMINATED PIEZOELECTRIC DEVICE

(75) Inventors: Takaaki Hira, Kagoshima-ken (JP);
Takeshi Okamura, Kagoshima-ken (JP);
Masaki Terazono, Kagoshima-ken (JP);
Hirotaka Tsuyoshi, Kagoshima-ken (JP); Ryuusuke Tsuyoshi, legal representative, Kagoshima-ken (JP);
Katsushi Sakaue, Kagoshima-ken (JP)

(73) Assignee: Kyocera Corporation, Kyoto (JP)

( * ) Notice: Subject to any disclaimer, the term of this patent is extended or adjusted under 35 U.S.C. 154(b) by 191 days.

(21) Appl. No.: 10/596,475

(22) PCT Filed: Dec. 17, 2004

(86) PCT No.: PCT/JP2004/019447

§ 371 (c)(1),
(2), (4) Date: May 15, 2007

(87) PCT Pub. No.: WO2005/062396

PCT Pub. Date: Jul. 7, 2005

(65) Prior Publication Data

US 2007/0209173 A1    Sep. 13, 2007

(30) Foreign Application Priority Data

Dec. 24, 2003 (JP) ............................. 2003-426902

(51) Int. Cl.
*H01L 41/047* (2006.01)

(52) U.S. Cl. .................... 310/363; 310/328; 310/358

(58) Field of Classification Search ......... 310/363–366, 310/358, 328
See application file for complete search history.

(56) References Cited

U.S. PATENT DOCUMENTS

| 6,819,540 B2 * | 11/2004 | Allen et al. ............ 361/302 |
| 2007/0209173 A1 * | 9/2007 | Hira et al. ............ 29/25.35 |
| 2008/0222866 A1 * | 9/2008 | Miyoshi ............ 29/25.35 |

FOREIGN PATENT DOCUMENTS

| JP | 07-231127 | | 8/1995 |
| JP | 11145525 A | * | 5/1999 |
| JP | 2002-261346 | | 3/2002 |
| JP | 2002-299710 | | 10/2002 |
| JP | 2003-324223 | | 11/2003 |
| JP | 2006228866 A | * | 8/2006 |

* cited by examiner

*Primary Examiner*—J. SanMartin
(74) *Attorney, Agent, or Firm*—Hogan & Hartson LLP

(57) ABSTRACT

A laminated piezoelectric device obtained by alternately laminating the piezoelectric layers containing Pb and the conducting layers containing palladium as a conducting component, wherein the piezoelectric layer formed between the two conducting layers has layer regions where Pb and Pd are mixed together in the interfacial portions thereof relative to the conducting layers, the layer regions having a thickness of not larger than 3% of the thickness of the piezoelectric layer. The laminated piezoelectric device is formed by co-firing the Pb-containing piezoelectric layers and the palladium (Pd)-containing layers, the piezoelectric layers therein having a large insulation resistance and good piezoelectric characteristics.

19 Claims, 3 Drawing Sheets

LAMINATED PIEZOELECTRIC DEVICE

TECHNICAL FIELD

The present invention relates to a laminated piezoelectric device and, more specifically, to a laminated piezoelectric device of the co-fired type in which conducting layers and piezoelectric layers are formed by co-firing, to a method of producing the same, and to an injection apparatus equipped with the laminated piezoelectric device.

BACKGROUND ART

A co-fired laminated piezoelectric device having a body of laminated piezoelectric material of a pole-like shape in which the conducting layers and the piezoelectric layers are formed by co-firing has heretofore been known, and has been applied to a piezoelectric actuator, a piezoelectric transformer and an ink-jet printer head. AS described in JPA-293625/2002, the co-fired laminated piezoelectric device is fabricated by co-firing a pole-like laminate obtained by alternately laminating the ceramic green sheets (that correspond to the piezoelectric layers) and the conducting patterns (that correspond to the conducting layers) in the atmosphere to form a pole-like laminated piezoelectric material, and by forming external electrodes on the side surfaces of the pole-like laminated piezoelectric material.

As the piezoelectric ceramic that constitutes the piezoelectric layers in the conventional laminated piezoelectric device, in general, there has been used a piezoelectric ceramic that contains perovskite composite oxide containing Pb, such as $Pb(Zr, Ti)O_3$ as a main crystal phase. As the conducting components in the conducting layers, further, there have been used metal Pd and an Ag—Pd alloy.

DISCLOSURE OF THE INVENTION

The laminated piezoelectric device in which the Pb-containing piezoelectric layers and the palladium (Pd)-containing conducting layers are formed by coring, has an advantage of a high adhering strength between the conducting layers and the piezoelectric layers accompanied, however, by a problem of low insulation resistance in the piezoelectric layers.

It is, therefore, an object of the present invention to provide a laminated piezoelectric device formed by co-firing the Pb-containing piezoelectric layers and the palladium (Pd)-containing layers, the piezoelectric layers therein having a large insulation resistance, and a method of producing the same.

Another object of the present invention is to provide an injection apparatus by using the above laminated piezoelectric device.

According to the present invention, there is provided a laminated piezoelectric device obtained by alternately laminating the piezoelectric layers containing Pb and the conducting layers containing palladium as a conducting component, wherein the piezoelectric layer formed between the two conducting layers has layer regions where Pb and Pd are mixed together in interfacial portions thereof relative to the conducting layers, the layer regions having a thickness of not larger than 3% of the thickness of the piezoelectric layer.

In the above laminated piezoelectric device, it is desired that:

(1) The layer regions have a thickness of 1 to 3% of the thickness of the piezoelectric layer;

(2) The piezoelectric layer has a thickness of not smaller than 50 μm;

(3) The piezoelectric layer is formed by a piezoelectric ceramic which has, as a crystal phase, a perovskite composite oxide of an $ABO_3$ composition containing Pb in the A-site and Zr and Ti in the B-site, an element ratio (A/B) of the A-site element and the B-site element in the piezoelectric layer being smaller than 1;

(4) The conducting layer has a thickness of not smaller than 1 μm;

(5) The conducting layer contains, as conducting components, an element of the Group VIII of periodic table including at least palladium and an element of the Group Ib of periodic table;

(6) When the content of the element of the Group VIII is denoted by M1 mass % and the content of the element of the Group Ib is denoted by M2 mass %, the conducting layer satisfies the following conditions:

$0.001 \leq M1 \leq 15$, $85 \leq M2 \leq 99.999$, $M1+M2=100$ mass %;

(7) The conducting layer contains at least one kind of element selected from the group consisting of Ni, Pt, Rh, Ir, Ru and Os as well as palladium as the elements of the Group VIII of periodic table, and at least one kind of Cu, Ag or Au as an element of the Group Ib of periodic table;

(8) The piezoelectric layer contains fine voids distributed in an amount of not larger than 15% per the volume of the piezoelectric layer;

(9) The voids are distributed in a flat shape with the direction of thickness of the piezoelectric layer as a short axis and the direction of surface of the piezoelectric layer as a long axis; and

(10) When the length of the short axis of the void is denoted by "a" and the length of the long axis thereof by "b", there hold $b/a \leq 4$ and $b \geq 3$ μm.

According to the present invention, further, there is provided a method of producing a laminated piezoelectric device comprising steps of:

forming a conducting paste layer by applying a conducting paste containing palladium as a conducting component onto one surface of a green sheet that is formed by using a piezoelectric starting powder containing a Pb component;

forming a pole-like laminate by laminating a plurality of pieces of green sheets having the conducting paste layer on the surfaces thereof in a manner that the green sheets and the conducting paste layers are alternately positioned;

forming a pole-like laminated piezoelectric material by firing the pole-like laminate in an atmosphere having an oxygen partial pressure of $10^{-12}$ atm to 0.195 atm; and forming external electrodes by applying an external electrode paste onto the side surfaces of the pole-like laminated piezoelectric material followed by firing.

In the above production method, it is desired that:

(a) The pole-like laminate is fired at not higher than 1000° C.;

(b) There is used the green sheet formed by blending the piezoelectric starting powder with resin beads.

According to the present invention, further, there is provided an injection apparatus comprising a container having an injection hole, a laminated piezoelectric device contained in the container, and a valve for injecting a liquid through the injection hole being driven by the laminated piezoelectric device.

When the piezoelectric layers containing Pb and the conducting layers containing palladium (Pd) as a conducting component are co-fired, Pd in the conducting layers reacts with Pb (existing in the form of an oxide) in the piezoelectric layers and diffuses into the piezoelectric layers. In the piezoelectric layer formed between the two conducting layers, therefore, there are formed layer regions where Pb and Pd are mixed together (hereinafter, the layer regions are called Pb—Pd mixed regions) in the interfacial portions thereof relative to the conducting layers. As will be described in Examples appearing later, the Pb—Pd mixed regions can be confirmed by using an analytical electron microscope. In the Pb—Pd mixed region, Pd is present in the form of an oxide or an alloy thereof with Pb.

Due to the presence of the above Pb—Pd mixed regions, the adhesion improves between the conducting layer and the piezoelectric layer, but the insulation resistance decreases in the piezoelectric layer. A decrease in the insulation resistance results in a decrease in the piezoelectric performance such as a decrease in the electrostatic capacity. In the present invention, the piezoelectric layer containing a Pb component and the conducting layer containing Pd are co-fired in an atmosphere having an oxygen partial pressure of $10^{-12}$ atm to 0.195 atm to suppress the reaction of Pd in the conducting layer with Pb in the piezoelectric layer and to suppress Pd from diffusing into the piezoelectric layer, whereby the thickness of the Pb—Pd mixed region is adjusted to be not larger than 3% and, particularly, in a range of 1 to 3% with respect to the thickness of the piezoelectric layer. Therefore, it is allowed to enhance the piezoelectric characteristics while maintaining a suitable degree of adhesion and suppressing a decrease in the insulation of the piezoelectric layer. In the conventional laminated piezoelectric device, for example, the piezoelectric layers and the conducting layers are co-fired in an atmosphere having a high oxygen concentration such as in the open air (oxygen partial pressure of 0.2 atm). Therefore, the Pb—Pd mixed regions are thickly formed in the piezoelectric layer (formed having a thickness of larger than 3% of the thickness of the piezoelectric layer), the insulation is greatly deteriorated in the piezoelectric layer, and a decrease in the piezoelectric characteristics is not avoided.

BEST MODE FOR CARRYING OUT THE INVENTION

Laminated Piezoelectric Device

Figure 1:
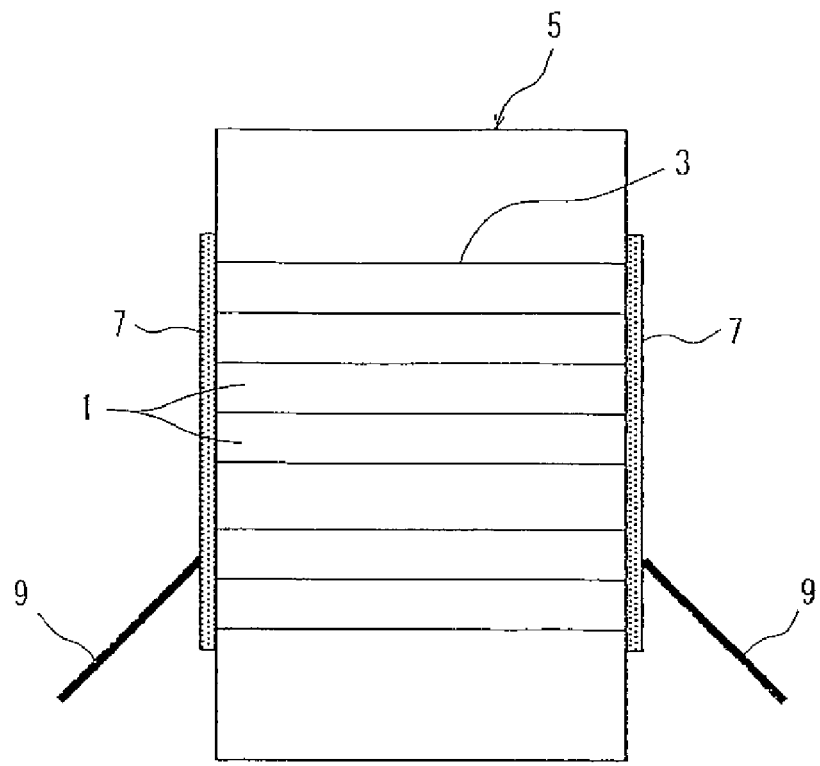
FIG. 1 is a schematic sectional view of a laminated piezoelectric device according to an embodiment of the present invention.

Referring to FIG. 1 which schematically illustrates the structure of a laminated piezoelectric device of the present invention, the laminated piezoelectric device has a pole-like laminate (device body) 5 obtained by alternately laminating a plurality of piezoelectric layers 1 and a plurality of conducting layers (internal electrode layers) 3. External electrode plates 7, 7 are connected to different side surfaces of the device body 5, and lead wires 9 are connected to the external electrode plates 7 (i.e., one of the external electrode plates 7, 7 serves as a positive electrode and the other one serves as a negative electrode).

As will be understood from FIG. 1, further, the neighboring conducting layers 3 are connected to different external electrode plates 7. When a predetermined voltage is applied to the external electrode plates 7, 7, therefore, electric fields of opposite directions are applied to the neighboring piezoelectric layers 1, 1, and a displacement is produced in the direction of lamination due to an inverse piezoelectric effect.

Figure 3:
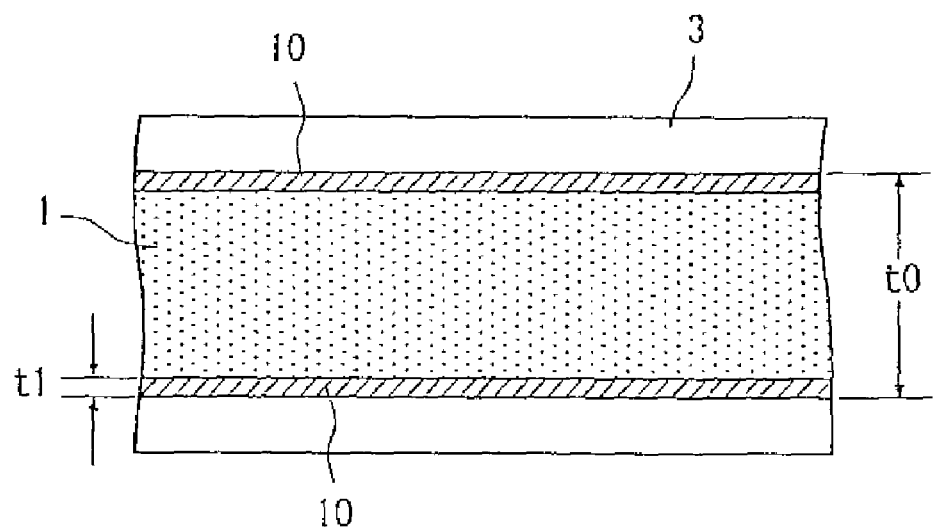
FIG. 3 is a sectional view illustrating, on an enlarged scale, a piezoelectric layer in the laminated piezoelectric device of FIG. 1.

As shown in FIG. 3, further, Pb—Pd mixed regions 10 are formed in the interfacial portions of the piezoelectric layer 1 relative to the conducting layers 3.

In the laminated piezoelectric device, the piezoelectric layers 1 are constituted by using the piezoelectric ceramic containing a Pb component. A representative piezoelectric ceramic containing Pb is the one in which a perovskite composite oxide of an $ABO_3$ composition containing Pb as an A-site element species is precipitated as a main crystal phase. A particularly preferred perovskite composite oxide contains Zr and Ti as element species for constituting the B-site. Ideally, the above perovskite composite oxide can be expressed by the following formula (1),

$$(Pb)(Zr,Ti)O_3 \qquad (1)$$

Further, Pb present in the A-site may be substituted by other elements, for example, by at least one kind of element selected from the group consisting of Ca, Sr, Ba, Nd and Li. Further, Zr and Ti in the B-site may be partly substituted by other elements. As the elements for substituting the B-site, there can be exemplified such elements as Y, Dy, Ho, Er, Tm, Yb, Lu, W, Nb and Sb, and Zr and Ti may be partly substituted by one or a plurality of the above B-site-substituting elements. The piezoelectric layers 1 formed by using the Pb-containing piezoelectric ceramic help increase the Curie temperature and the effective piezoelectric distortion constant.

In the laminated piezoelectric device of the present invention, it is desired that the element ratio (A/B) of the element constituting the A-site and the element constituting the B-site in the piezoelectric layer 1 is smaller than 1 and, particularly, is in a range of 0.980 to 0.999. That is, by making the element constituting the B-site present in an amount in slight excess of the element constituting the A-site, much of the Pb element is made present in the A-site of the perovskite composite oxide maintaining stability, making it possible to decrease the amount of Pb that does not contribute to forming the perovskite composite oxide, to effectively suppress the reaction thereof with Pd in the conducting layer 3 that will be described later and to avoid an increase in the thickness of the Pb—Pd mixed region 10.

In the piezoelectric layer 1 formed by the piezoelectric ceramic using the perovskite composite oxide as chief crystals, further, it is desired that the contents of these element species are so set that the average valency of the element species constituting the B-site is in a range of 4.002 to 4.009. In the piezoelectric layer 1 in which the average valency of the element species constituting the B-site lies in the above range, the amount of oxygen becomes excessive as compared to that of the perovskite composite oxide of an ideal composition. As a result, the reaction is suppressed between Pd in the conducting layer 3 and Pb in the piezoelectric layer 1 at the time of co-firing effectively avoiding an increase in the thickness of the Pb—Pd mixed regions. Here, the average valency of element species constituting the B-site stands for a value of ionization stemming from a general balance of electrons of elements in the periodic table. For example, when there are contained 0.4 mols of Zr (valency of +4), 0.4 mols of Ti (valency of +4), 0.1 mol of W (valency of +6) and 0.1 mol of Yb (valency of +3) per mol of the total amount of element species constituting the B-site, an average valency becomes $4 \times 0.4 + 4 \times 0.4 + 6 \times 0.1 + 3 \times 0.1 = 4.1$.

It is desired that the perovskite composite oxide constituting the piezoelectric layer 1 has an average grain size in a range of 1 to 6 μm, particularly, 1.5 to 4 μm and, most desirably, 2 to 3 μm from the standpoint of enhancing the piezoelectric characteristics and improving the mechanical strength. The average grain size can be controlled relying upon the starting powder and the average grain size of the calcined product.

Though there is no particular limitation, it is desired that the above piezoelectric layer 1 has a thickness of not smaller than 50 μm from the standpoint of suppressing a decrease in the piezoelectric characteristics in the Pb—Pd mixed regions 10.

The conducting layers 3 contain at least Pd. It is desired that the conducting layers 3 are formed by using a metal of the Group Ib of periodic table, such as Ag, Cu or Au or an alloy thereof from the standpoint of maintaining a highly electrically conducting property. In this case, however, the firing temperature becomes so low that it becomes difficult to co-fire the conducting layers 3 together with the piezoelectric layers 1. In the present invention, therefore, the conducting layers 3 are formed by using Pd together with the above metal of the Group Ib (particularly preferably, Ag). Therefore, the piezoelectric layers 1 and the conducting layers 3 can be co-fired. It is further allowable to use Pd together with the metal of the Group Ib in combination with other metals of the Group VIII of periodic table. As the metals of the Group VIII other than Pd, there can be exemplified Ni, Pt, Rh, Ir, Ru and Os. Among them, Pt is particularly desired. The metals of the Group VIII other than Pd can be used in amounts of not larger than 5 mol % per Pd.

In the present invention, when the content of the metal (inclusive of Pd) of the Group VIII in the conducting layer 3 is denoted by M1 mass % and the content of the metal of the Group Ib is denoted by M2 mass %, it is desired that the following conditions:

$0.001 \leq M1 \leq 15$, particularly, $3 \leq M1 \leq 8$, $85 \leq M2 \leq 99.999$, particularly, $92 \leq M2 \leq 97$, $M1 + M = 100$ mass %, are satisfied from the standpoint of accomplishing the co-firing yet maintaining a high electrically conducting property.

Further, the conducting layers 3 may contain a small amount of inorganic derivative component such as a perovskite composite oxide (or an oxide component for forming the composite oxide) used for forming the piezoelectric layers 1 to thereby enhance the adhesion among the conducting layers 3 and the piezoelectric layers 1. However, the inorganic dielectric component that is blended in large amounts impairs the electrically conducting property of the conducting layers 3. It is therefore desired that the inorganic dielectric component is contained in an amount of not larger than 5 mass % per the total amount of the conducting components constituting the conducting layers 3. It is further desired that the grain size of the inorganic dielectric component is smaller than the average grain size of the piezoelectric ceramic forming the piezoelectric layers 1.

The conducting layers 3 have a thickness of, preferably, not smaller than 1 μm. That is, upon selecting the thickness of the conducting layers 3 to be not smaller than 1 μm, it is made possible to effectively suppress the effect of the conducting component (Pd) in the conducting layers 3 that may partly diffuse into the piezoelectric layers 1, to maintain large effective areas of the conducting layers 3 and to suppress a decrease in the characteristics such as electrostatic capacity.

In the present invention as shown in FIG. 3, Pb—Pd mixed regions 10 are formed in the interfacial portions in the piezoelectric layers 1 relative to the conducting layers 3. It is important that the Pb—Pd mixed regions 10 have a thickness $t_1$ which is suppressed to be not larger than 3% and, particularly, not larger than 2.9% the thickness $t_0$ of the piezoelectric layers 1. That is, as described already, when the piezoelectric layers 1 containing the Pb component and the conducting layers 3 containing Pd are co-fired, Pd reacts with Pb (particularly, Pb oxide that does not contribute to forming the perovskite composite oxide) in the piezoelectric layers 1, and diffuses into the piezoelectric layers 1. As a result, Pb—Pd mixed regions 10 are formed in the interfacial portions in the piezoelectric layers 1 relative to the conducting layers 3. That is, in the Pb—Pd mixed regions 10, Pd is present in the form of an oxide thereof or an alloy thereof with Pb. In the present invention, the firing atmosphere is adjusted at the time of co-firing that will be described later to suppress the thickness $t_1$ of the Pb—Pd mixed regions 10 to be smaller than that of the conventional laminated piezoelectric device and to be not larger than 3% and, particularly, not larger than 2.9% the thickness to of the piezoelectric layers 1. This suppresses a decrease in the electric insulation of the piezoelectric layers 1 caused by the Pb—Pd mixed regions 10, avoids a decrease in the piezoelectric characteristics and maintains excellent piezoelectric characteristics. Here, however, when the thickness $t_1$ of the Pb—Pd mixed region 10 is too small, the adhesion decreases among the piezoelectric layers 1 and the conducting layers 3 permitting the exfoliation to easily take place. It is, therefore, desired that the thickness $t_1$ is not smaller than 1% the thickness $t_0$ of the piezoelectric layers 1.

It is desired that the piezoelectric layers 1 and the conducting layers 3 are formed in a number of 100 to 400 to obtain desired characteristics. Further, the laminated piezoelectric device (device body 5) may have any pole-like shape such as a square pole, a hexagonal pole or a cylindrical pole but desirably has the shape of a square pole from the standpoint of easy cutting.

Figure 4:
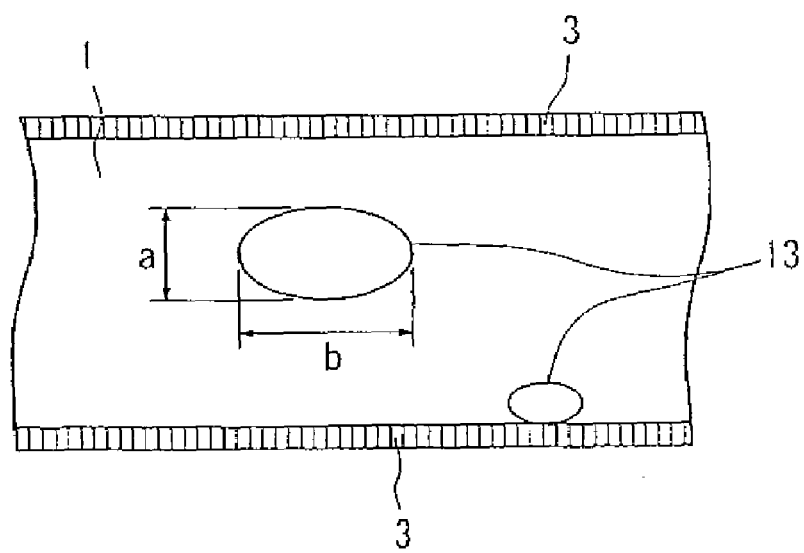
FIG. 4 is a schematic view of the structure of the piezoelectric layer according to a preferred example of the present invention.

In the above-mentioned laminated piezoelectric device of the present invention, further, it is desired that fine voids 13 are distributed in the piezoelectric layer 1 as shown in FIG. 4. That is, upon distributing such fine voids, it is allowed to enhance the deformation of the piezoelectric layers 1 and to increase the amount of displacement based on the inverse piezoelectric effect. Desirably, the total amount of the voids 13 is not larger than 15% by volume and, particularly, not larger than 5% by volume with respect to the piezoelectric layers 1 from the standpoint of avoiding a decrease in the strength of the piezoelectric layers 1.

Further, the voids 13 are formed by being blended with resin beads and by firing, undergo the deformation into a flat shape by the pressure exerted in the step of production, and are distributed in the piezoelectric layers 1 in such a shape that the direction of thickness thereof is a short axis and the direction of surfaces thereof is a long axis as shown in FIG. 4. It is desired that the voids 13 thus distributed have a small degree of flatness and satisfy the following conditions when, for example, the length of the short axis thereof is denoted by "a" and the length of the long axis thereof by "b":

$b/a \leq 4$, particularly, $b/a \leq 2$, and $b \geq 3$ μm and, particularly, $3 \text{ μm} \leq b \leq 20 \text{ μm}$.

That is, when the voids 13 have a large degree of flatness, the electric field concentrates at both ends (portions of a small curvature) of voids 13 when the electric field is applied to the piezoelectric layers 1, and stress concentrates at portions where the electric field is concentrated causing cracks to easily occur. By forming the voids 13 in a shape close to a sphere having a small degree of flatness, however, the electric field is effectively suppressed from concentrating, and the occurrence of crack is avoided. It is further desired that the voids 13 have a length a of short axis in a range of $a \leq 0.5 \ t_0$ and, particularly, $a \leq 0.15 \ t_0$ ($t_0$: thickness of the piezoelectric layer 1). When the length a of the short axis (length in the direction of thickness) is too great, the breakdown voltage of the piezoelectric layers 1 may decrease.

As will be described later, the shape of the voids 13 can be adjusted depending upon the grain size of beads that are used, temperature and pressure applied to the green sheet for forming the piezoelectric layers of before being fired.

(Production of the Laminated Piezoelectric Device)

In producing the above-mentioned laminated piezoelectric device, first, a piezoelectric starting powder of a predetermined composition is prepared, is calcined and, is molded to prepare a green sheet for forming piezoelectric layers.

The piezoelectric starting powder is a mixture of a powder of the starting compound for the A-site and a powder of the starting compound for the B-site. As the starting compound for the A-site, there can be used a Pb oxide and, as required, an oxide or a carbonate of the above-mentioned A-site-substituting element. As the starting compound for the B-site, there can be used a Zr oxide ($ZrO_2$), a Ti oxide ($TiO_2$) and, as required, oxides or carbonates of the above-mentioned B-site-substituting elements. Though there are various Pb oxides that can be used as the starting compound for the A-site, it is desired to use $Pb_3O_4$ from such a standpoint that it can be finely pulverized with ease, remains stable against a variety of solvents that will be described later, does not permit the composition thereof to vary, and can be easily adjusted for its composition. These starting compounds are, usually, so mixed together as to satisfy the composition ratio of the above formula (1). In the present invention, however, it is desired that the starting compounds are so mixed together that the element ratio (A/B) of the element constituting the A-site and the element constituting the B-site is smaller than 1 and is, particularly, 0.980 to 0.999. That is, by decreasing the amount of the starting Pb that does not contribute to forming the perovskite composite oxide, it is allowed to decrease the thickness of the above-mentioned Pb—Pd mixed regions.

It is further desired that the above starting powder is adjusted to be a fine powder having an average grain size $D_{50}$ of not larger than 0.8 μm so as to be effectively fired at a low temperature of 1000° C. or lower. The fine pulverization can be conducted by using, for example, a vibration mill, Atritor or a ball mill. In particular, it is desired to conduct the fine pulverization by wet-milling by using a ball mill containing, particularly, spherical balls of a diameter of not larger than 5 mm. As the material of the ball, it is desired to use zirconia since it is capable of suppressing impurities from mixing and of suppressing a decrease in the piezoelectric characteristics even in case the impurities are mixed stemming from the balls.

The starting powder finely pulverized as described above is, as required, dried or dehydrated and is calcined in a low temperature region of not higher than 900° C., preferably, 700 to 800° C. and, more preferably, 730 to 760° C. It is desired that the calcined body that is obtained is suitably milled and adjusted for its grain size so as to have a uniform grain size distribution of an average grain size $D_{50}$ of not larger than 0.8 μm and, particularly, an integrated grain size $D_{90}$ of not larger than 0.9 μm. It is desired that the BET specific surface area thereof is not smaller than 7 $m^2/g$ and, particularly, not smaller than 8 $m^2/g$ due to the milling. That is, as a result of finely pulverizing the starting powder, the calcined body needs be milled only slightly (milled to an extent of digesting the aggregate) to adjust the grain size and, hence, to maintain a high reactivity, making it possible to obtain the desired piezoelectric layers 1 through the firing at a low temperature of 1000° C. or lower.

Next, a powder of the calcined body of which the grain size is adjusted as described above is molded to obtain a green sheet for piezoelectric layers. The molding is conducted by using means known per se. For example, the calcined powder is mixed into an organic binder such as of an acrylic resin and is, as required, mixed with a solvent such as water or an alcohol and a plasticizer to prepare a slurry for molding. By using molding means such as a doctor blade method or an extrusion-molding method, the slurry is molded into the green sheet.

Further, when the above-mentioned voids 13 are to be formed in the piezoelectric layers 1, the slurry for molding is blended with resin beads in such an amount that the volumetric ratio of voids 13 lies in the above-mentioned range. It is desired that the resin beads have a shape close to a true sphere formed by the emulsion polymerization or the suspension polymerization so as to form voids 13 of a uniform shape and that the average particle size thereof is in a range of about 1 to about 30 μm. From the standpoint of cost, in general, there are preferably used beads of a polyolefin such as polyethylene or polypropylene or beads of an acrylic resin such as poly(meth) acrylate.

Onto one surface of the thus prepared green sheet for piezoelectric layers, there is printed, by a screen-printing method, a conducting paste prepared by mixing the conducting components for forming the conducting layers inclusive of Pd as conducting components with an organic binder and a solvent, thereby to form a conducting paste layer that becomes the conducting layer 3. After the conducting paste layer is dried, a plurality of green sheets forming the conducting paste layer are laminated in a predetermined number of pieces, and green sheets without the conducting paste are laminated on the uppermost layer and on the lowermost layer of the laminate to fabricate a pole-like laminate corresponding to the device body 5.

Next, the pole-like laminate is integrated under the application of a pressure being heated at 50 to 200° C., cut into a predetermined size, and from which the binder is removed being heated at a temperature of about 300 to about 400° C.

for about 5 to about 40 hours, followed by firing. That is, when the green sheet is blended with the above resin beads, the resin beads are deformed into a slightly flat shape as the pole-like laminate is pressurized and heated, and are distributed in a form as shown in FIG. 4. Upon removing the binder, the resin beads are removed to form the voids 13. The form of the voids 13 vary to some extent due to contraction by firing. Basically, however, the form of the voids 13 is dependent upon the pressure exerted on the pole-like laminate and the form of the resin beads while being heated. Therefore, the pressure and the heating temperature are so set as to form voids 13 of the form that satisfies the above-mentioned conditions. For example, when the pressure is great and the heating temperature is high, the resin beads deform to a large degree and there are formed voids 13 having a high degree of flatness.

In the present invention, the firing is conducted in a low temperature region of not higher than 1000° C. and, particularly, at 950 to 980° C. for about 2 to 5 hours whereby the conducting paste layers and the green sheets are co-fired, and there is obtained a laminated sintered body corresponding to the device body 5 in which the dense piezoelectric layers 1 and the conducting layers 3 are alternately laminated one upon the other.

In the present invention, it is important that the above firing is conducted in an atmosphere having an oxygen partial pressure of $10^{-12}$ atm to 0.195 atm. Upon conducting the firing in the above atmosphere, Pd in the conducting paste layers reacts with the Pb component (lead oxide) in the green sheets to a suitable degree and diffuses into the green sheets to thereby form Pb—Pd mixed regions 10 of a suitable degree of thickness described above in the interfacial portions of the piezoelectric layers 1 relative to the conducting layers 3. For example, when the firing is conducted in an atmosphere (e.g., open air) having an oxygen partial pressure greater than the above range, Pd reacts in an increased amount with the Pb component whereby the Pb—Pd mixed regions 10 formed in the piezoelectric layers 1 possess a thickness $t_1$ greater than the above range, and the insulating resistance of the piezoelectric layers 1 decreases. Further, when the firing is conducted in an atmosphere having an oxygen partial pressure smaller than the above range, Pd reacts in a very small amount with the Pb component and is not almost diffused. As a result, the Pb—Pd mixed regions 10 possess a thickness $t_1$ which is very decreased, and the adhesion decreases between the piezoelectric layers 1 and the conducting layers 3 permitting exfoliation to easily occur. When Ni and Cu are used together with Pd as conducting components in the conducting paste, it is desired that the oxygen partial pressure in the firing atmosphere is brought to the particularly lower side in the above-mentioned range to prevent Ni and Cu from oxidizing.

Ends of the conducting layers 3 are exposed on the side surfaces of the thus obtained device body (laminated sintered body) 5. Therefore, the ends of every other conducting layers 3 are ground in the predetermined two side surfaces of the device body 5 to form grooves. The grooves formed in one side surface and the grooves formed in the other side surface are alternate to each other. These grooves, usually, have a depth of about 50 to about 150 μm and have a width (length in the direction of lamination) of about 50 to about 100 μm.

The thus formed grooves are, as required, filled with an insulator such as a silicone rubber, and the external electrode plates 7 are stuck to the side surfaces forming the grooves by using an adhesive or the like. Therefore, the one external electrode plate 7 and the other external electrode plate 7 are connected to the ends of different conducting layers 3 in an alternate manner.

Figure 2:
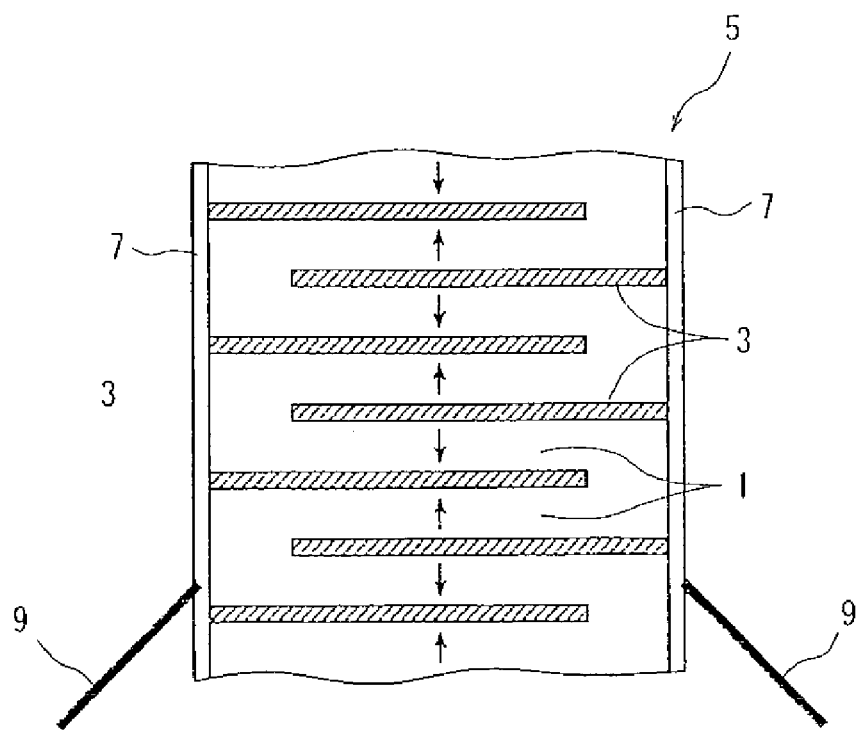
FIG. 2 is a view, on an enlarged scale, of a portion illustrating a stratified structure of the laminated piezoelectric device of FIG. 1.

Thereafter, lead wires 9 are connected to the external electrode plates 7, 7 to obtain a laminated piezoelectric device of a structure shown in FIGS. 1 and 2. The laminated piezoelectric device is coated over the outer peripheral surfaces thereof with a silicone rubber by such a method as dipping, and is put to the polarization treatment by applying a polarizing electric field of 3 kV/mm, and is finally used as a piezoelectric actuator.

(Injection Apparatus)

The above laminated piezoelectric device can be produced by co-firing the conducting layers that become the internal electrode layers and the piezoelectric layers suppressing a decrease in the insulation resistance of the piezoelectric layers, maintaining a high electrostatic capacity and exhibiting excellent piezoelectric characteristics. The laminated piezoelectric device is useful as an injection apparatus for media such as fuels and gases. The injection apparatus has the laminated piezoelectric device of the above-mentioned structure in a container that has, for example, an injection hole, and is equipped with a valve for injecting a liquid from the injection hole when the laminated piezoelectric device is driven.

Figure 5:
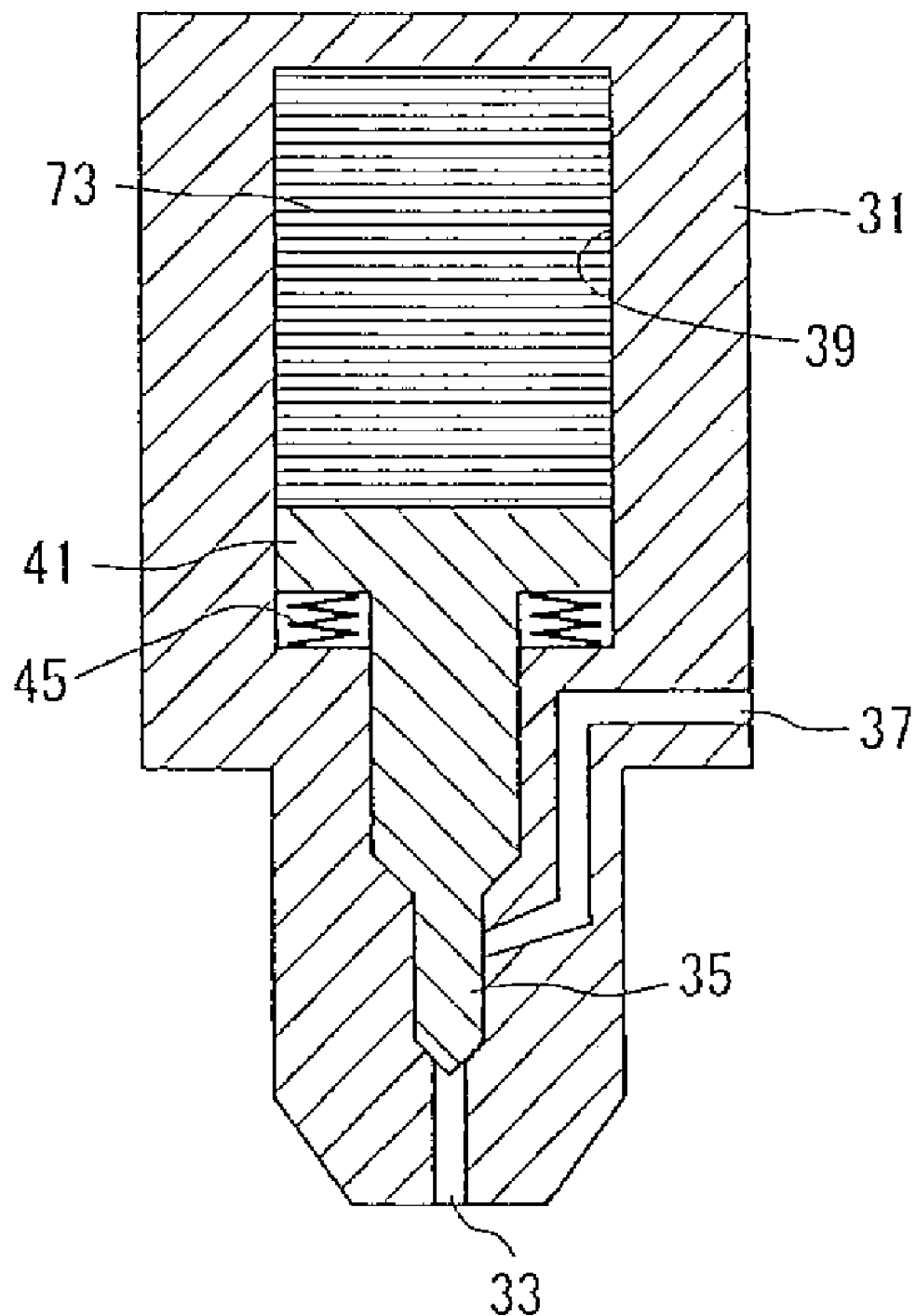
FIG. 5 is a view illustrating an injection apparatus by using the laminated piezoelectric device of FIG. 1.

A constitution of the above injection apparatus is shown in FIG. 5, wherein a laminated piezoelectric device (piezoelectric actuator) 43 of the above-mentioned structure is contained in a cylinder 39 of a container 31.

An injection hole 33 is formed at an end of the container 31, and a needle valve 35 is contained in the container 31 to open and close the injection hole 33.

A fuel passage 37 is communicated with the injection hole 33 in a manner to be interrupted by the needle valve 35. The fuel passage 37 is coupled to an external fuel supply, and a fuel is fed to the fuel passage 37 at all times maintaining a predetermined high pressure. That is, when the needle valve 35 permits the injection hole 33 to be opened, the fuel supplied to the fuel passage 37 is injected into a combustion chamber (not shown) of an internal combustion engine with the predetermined high pressure.

Further, an upper end of the needle valve 35 has a large diameter, is continuous to a piston 41 which can slide in the cylinder 39, and the piston 41 is urged upward by an initially coned disc spring 45 and is coupled to the piezoelectric actuator 43 contained in the cylinder 39.

In this injection apparatus, when the piezoelectric actuator 43 extends due to the application of a voltage, the piston 41 is pushed, the needle valve 35 closes the injection hole 33, and the supply of fuel is interrupted. When the application of voltage discontinues, further, the piezoelectric actuator 43 contracts, the initially coned disc spring 45 pushes the piston 41 back, and the injection hole 33 is communicated with the fuel passage 37 permitting the fuel to be injected.

The injection apparatus employs the above-mentioned laminated piezoelectric device of high performance fabricated at a low cost as the actuator which is the heart of the device. Therefore, the present invention makes it possible to enhance performance of the injection apparatus and to decrease its cost.

Examples

The invention will now be described by way of the following Experiments.

(Experiment 1)

Powders of $Pb_3O_4$, $ZrO_2$, $TiO_2$, $BaCO_3$, $SrCO_3$, $WO_3$ and $Yb_2O_3$ of high purities were weighed in predetermined amounts, and were wet-mixed in a ball mill having zirconia balls of a diameter of 5 mm for 20 hours to prepare a starting powder for the piezoelectric layers. In the starting powders, when the perovskite composite oxide to be formed was expressed by the following formula,

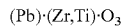
(Pb)·(Zr,Ti)·O₃ the element ratios (A/B) of the A-site element and the B-site element were set to be 0.99 to 1 (see Table 1), and the average valencies of the B-site were set to be 4.005.

The above starting powders were dehydrated, dried, calcined at 750° C. for 3 hours, and were pulverized to adjust average grain sizes ($D_{50}$) of the calcined bodies to be not larger than 0.8 μm and BET specific surface areas to be not smaller than 8 m²/g.

Next, the above calcined powders, acrylic resin binder and dibutyl phthalate (plasticizer) were mixed together to prepare slurries from which ceramic green sheets of a thickness of 150 μm were prepared by a slip-casting method. Conducting pastes comprising Ag—Pd as a chief component and having Ag/Pd ratios as shown in Table 1 were printed onto the surfaces on one side of the green sheets in a predetermined pattern maintaining a thickness of 5 μm by a screen-printing method, and were dried. Two hundred pieces of the green sheets forming the conducting paste layers were laminated, and 10 pieces of green sheets without coated with the conducting paste were laminated on both the upper end and the lower end of the laminates.

Next, the laminates were integrated by the application of a pressure while being heated at 100° C. The laminates were cut into a size of 12 mm×12 mm and, thereafter, the binder was removed therefrom at 800° C. for 10 hours. The laminates were fired at 950 to 1000° C. for 2 hours to obtain laminated sintered bodies that could be used as the actuator bodies.

External electrode plates (positive electrode plate and negative electrode plate) were formed on the two side surfaces of the laminated sintered bodies so as to alternately meet the ends of the conducting layers included in the piezoelectric ceramics along the two side surfaces. Thereafter, the lead wires were connected to the positive electrode plate and to the negative electrode plate, and the outer peripheral surfaces were coated with a silicone rubber by dipping followed by the application of a polarizing voltage of 3 kV/mm to effect the polarization treatment thereby to obtain laminated piezoelectric devices.

The thus obtained laminated piezoelectric devices were evaluated for the thickness of the Pb—Pd mixed regions in the piezoelectric layers, for their insulation resistance, for their effective piezoelectric distortion constants, and for their Curie temperatures by the methods described below. The results were as shown in Table 1.

As for the thickness of the Pb—Pd mixed regions, the cut surface of the piezoelectric layer was polished, the elemental components were analyzed by using an analytical electron microscope, and the thickness was expressed as a ratio to the thickness of the piezoelectric layer.

The insulating resistance was expressed by a resistance measured 30 seconds after the application of a voltage of 1 V.

The effective piezoelectric distortion constant was evaluated by applying a voltage of 0 to 200 V in a state where pre-load of 150 kgf has been applied in a direction of lamination to the samples fixed onto a vibration-proof plate, measuring the amounts of change in the overall length of the samples, and dividing the amounts of change by the number of the laminated layers and by the applied voltage.

The Curie temperatures were found by measuring the temperature characteristics of electrostatic capacities of the piezoelectric ceramics.

TABLE 1

| Sample No. | A/B ratio | Conducting Layer Composition | O2 partial pressure in the firing atm. Atm | Thickness of mixed region % | Exfoliation | Insulation resistance Ω | Effective piezoelectric distort. Const. $d_{33}$ pm/V | Curie temp. ° C. |
|---|---|---|---|---|---|---|---|---|
| *1 | 0.99 | 95/5 | 0.200 | 4.00 | No | $10^8$ | 860 | 332 |
| 2 | 0.99 | 95/5 | 0.195 | 2.70 | No | $6 \times 10^8$ | 890 | 331 |
| 3 | 0.99 | 95/5 | 0.190 | 2.00 | No | $7 \times 10^8$ | 880 | 330 |
| 4 | 0.99 | 95/5 | 0.180 | 0.90 | Yes | $8 \times 10^8$ | 870 | 329 |
| 5 | 1 | 95/5 | 0.195 | 3.00 | No | $4 \times 10^8$ | 860 | 328 |
| 6 | 0.99 | 90/10 | 0.195 | 2.80 | No | $5 \times 10^8$ | 890 | 332 |
| 7 | 0.99 | 85/15 | 0.195 | 2.90 | No | $5 \times 10^8$ | 890 | 333 |

*a sample lying outside the scope of the present invention

From the results of Table 1, the samples Nos. 2 to 7 which were the laminated piezoelectric devices of the invention all remained stable exhibiting insulation resistances of not smaller than $4 \times 10^8 \Omega$, effective piezoelectric constants of not smaller than 860 pm/V and Curie temperatures of as high as 328° C. without exfoliation. In these samples the ceramics forming the piezoelectric layers all possessed relative densities of not smaller than 95% and average grain sizes of 1 to 6 μm.

In the sample No. 1 prepared by firing in the atmosphere (open air) having an oxygen partial pressure of 0.2 atm, on the other hand, the thickness of the Pb—Pd mixed region was as great as 4% while the insulation resistance was $10^8 \Omega$ which was smaller than those of the samples of the present invention.

(Experiment 2)

Laminated piezoelectric devices were prepared in quite the same manner as the samples Nos. 2 to 7 of Experiment 1 but blending the calcined powders which were the starting materials with polyethylene beads of a particle size of 5 to 20 μm (the laminates of green sheets were integrated by the application of heat and pressure, i.e., a temperature of 100° C. and a pressure of 10 MPa). Thus, voids having a short axis a=5 μm and a long axis b=20 μm were distributed at a ratio of 5% by volume in the piezoelectric layers of the laminated piezoelectric devices. A voltage of 2 kV/mm was applied to the laminated piezoelectric devices to confirm the distortion. It was found that the amount of distortion had been increased as compared to the samples of Experiment 1 without voids. Further, no crack was caused by the concentration of the electric field.

The invention claimed is:

1. A laminated piezoelectric device obtained by alternately laminating piezoelectric layers containing Pb and conducting layers containing palladium as a conducting component, wherein
the piezoelectric layer formed between the two conducting layers has layer regions where Pb and Pd are mixed together in interfacial portions thereof relative to said conducting layers, said layer regions having a thickness of not larger than 3% of the thickness of said piezoelectric layer.

2. A laminated piezoelectric device according to claim 1, wherein said layer regions have a thickness of 1 to 3% of the thickness of said piezoelectric layer.

3. A laminated piezoelectric device according to claim 1, wherein said piezoelectric layer has a thickness of not smaller than 50 µm.

4. A laminated piezoelectric device according to claim 1, wherein said piezoelectric layer is formed by a piezoelectric ceramic which has, as a crystal phase, a perovskite composite oxide of an $ABO_3$ composition containing Pb in the A-site and Zr and Ti in the B-site, the element ratio (A/B) of the A-site element and the B-site element in said piezoelectric layer being smaller than 1.

5. A laminated piezoelectric device according to claim 1, wherein said conducting layer has a thickness of not smaller than 1 µm.

6. A laminated piezoelectric device according to claim 1, wherein said conducting layer contains, as conducting components, an element of the Group VIII of periodic table including at least palladium and an element of the Group Ib of periodic table.

7. A laminated piezoelectric device according to claim 6, wherein when the content of the element of the Group VIII is denoted by M1 mass % and the content of the element of the Group Tb is denoted by M2 mass %, said conducting layer satisfies the following conditions:

$0.001 \leq M1 \leq 15$, $85 \leq M2 \leq 99.999$, $M1+M2=100$ mass %.

8. A laminated piezoelectric device according to claim 6, wherein said conducting layer contains at least one kind of element selected from the group consisting of Ni, Pt, Rh, Ir, Ru and Os as well as palladium as the elements of the Group VIII of periodic table, and at least one kind of Cu, Ag or Au as an element of the Group Ib of periodic table.

9. A laminated piezoelectric device according to claim 1, wherein said piezoelectric layer contains fine voids distributed in an amount of not larger than 15% per the volume of the piezoelectric layer.

10. A laminated piezoelectric device according to claim 9, wherein said voids are distributed in a flat shape with the direction of thickness of the piezoelectric layer as a short axis and the direction of surface of the piezoelectric layer as a long axis.

11. A laminated piezoelectric device according to claim 10, wherein when the length of the short axis of said void is denoted by a and the length of the long axis thereof by b, there hold $b/a \leq 4$ and $b \leq 3$ µm.

12. A laminated piezoelectric device according to claim 11, wherein the length (a) of the short axis of said void is in the range of $a \leq 0.5 \, t_0$ ($t_0$: the thickness of the piezoelectric layer).

13. An injection apparatus comprising a container having an injection hole, a laminated piezoelectric device of claim 1 contained in said container, and a valve for injecting a liquid through said injection hole being driven by said laminated piezoelectric device.

14. A laminated piezoelectric device according to claim 1, wherein said piezoelectric device is formed by a piezoelectric layers having, as a crystal phase, a perovskite composition oxide of an $ABO_3$ composition containing Pb in the A-site and Zr and Ti in the B-site, the average valency of the element species constituting the B-site being larger than 4.

15. A laminated piezoelectric device according to claim 14, wherein said average valency of the element species constituting the B-site is in the range of 4.002 to 4.009.

16. A laminated piezoelectric device according to claim 1, wherein said conducting layers contain an inorganic derivative component.

17. A laminated piezoelectric device according to claim 16, wherein said inorganic derivative component is a perovskite composite oxide.

18. A laminated piezoelectric device according to claim 16, wherein said inorganic derivative component is contained in an amount of not larger than 5 mass % per the total amount of the conducting components constituting the conducting layers.

19. A laminated piezoelectric device according to claim 16, wherein the grain size of the inorganic derivative component is smaller than the average grain size of the piezoelectric ceramic forming the piezoelectric layer.

* * * * *